United States Patent
Hsu et al.

(10) Patent No.: US 8,405,232 B2
(45) Date of Patent: Mar. 26, 2013

(54) CHIP PACKAGE STRUCTURE

(75) Inventors: Chih-Hung Hsu, Taipei County (TW); Huan-Wen Chen, Taoyuan County (TW); Shih-Chieh Chiu, Taoyuan County (TW); Ying-Shih Lin, Taoyuan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 112 days.

(21) Appl. No.: 12/883,432

(22) Filed: Sep. 16, 2010

(65) Prior Publication Data
US 2011/0304062 A1    Dec. 15, 2011

(30) Foreign Application Priority Data

Jun. 11, 2010    (TW) .............................. 99119092 A (51) Int. Cl.
*H01L 23/28* (2006.01)

(52) U.S. Cl. ........... 257/787; 257/E51.02; 257/E33.059; 257/E31.117; 438/127

(58) Field of Classification Search .................... 257/82, 257/667–787, E51.02, E33.059, E31.117; 438/127; 437/212
See application file for complete search history.

(56) References Cited

U.S. PATENT DOCUMENTS

| | | | | |
|---|---|---|---|---|
| 4,701,999 A * | 10/1987 | Palmer | ........................... | 29/827 |
| 5,091,341 A * | 2/1992 | Asada et al. | .................... | 29/827 |
| 5,153,708 A * | 10/1992 | Ohikata et al. | ................ | 257/668 |
| 5,349,136 A * | 9/1994 | Abe et al. | ........................ | 425/121 |
| 5,684,327 A * | 11/1997 | Nakazawa et al. | ............ | 257/667 |
| 5,998,243 A * | 12/1999 | Odashima et al. | ............ | 438/127 |
| 7,425,727 B2 * | 9/2008 | Shoji et al. | ........................ | 257/82 |
| 8,202,746 B2 * | 6/2012 | Lee et al. | ........................ | 438/28 |
| 8,217,414 B2 * | 7/2012 | Hayashi | ........................ | 257/99 |
| 2004/0203194 A1 * | 10/2004 | Hamasaki | ..................... | 438/127 |

* cited by examiner

Primary Examiner — Jerome Jackson, Jr.
Assistant Examiner — Fang-Xing Jiang
(74) Attorney, Agent, or Firm — J.C. Patents (57) ABSTRACT

A chip package structure including a carrier, a chip and a molding compound is provided. The chip is disposed on the carrier. The molding compound encapsulates a portion of the carrier and the chip. The top surface of the molding compound has a pin one dot and a pin gate contact. The pin one dot is located at a first corner on the top surface. The pin gate contact is located at a second corner except the first corner. The invention further provides a chip package mold chase and a chip package process using to form the chip package structure.

19 Claims, 6 Drawing Sheets

CHIP PACKAGE STRUCTURE

CROSS-REFERENCE TO RELATED APPLICATION

This application claims the priority benefit of Taiwan application serial no. 99119092, filed on Jun. 11, 2010. The entirety of the above-mentioned patent application is hereby incorporated by reference herein and made a part of this specification.

BACKGROUND OF THE INVENTION

1. Field of the Invention

The present invention relates to a semiconductor package technique, in particular, to a chip package structure, a chip package mold chase and a chip package process.

2. Description of Related Art

As for the package of the integrated circuit, the carrier having chips disposed thereon is usually disposed between several mold chases. Then, the mold chases are combined to define a cavity and the carrier and the chips are disposed within the cavity. Thereafter, the molding compound material is injected into the cavity through the pin gates of the mold chases. After the mold chases are removed, the well-known chip package structure is completed. One method for injecting the molding compound material into the cavity is to inject the molding compound material from the tops of the carrier and the chips into the cavity through the pin gate of the top mold chase. The chip package structure comprises the carrier, the chips disposed on the carrier and the molding compound encapsulating a portion of the carrier and the chips.

Generally, after the molding compound material is injected from the tops of the carrier and the chips into the cavity to form the chip package structure and the mold chases are removed, there is a pin gate contact formed at the position on the top surface of the molding compound and the position is corresponding to the pin gate (the pin gate contact is an irregular crack structure formed by removing the excess molding compound from the chip package structure). Additionally, in order to easily identify the leads in the chip package structure in the later process, pin one dot, which is a recess structure, is formed on the top surface of the chip package structure while the chip package structure is formed. According to the current mold chases and the manufacturing process, the pin gate contact is usually located within the range of the pin one dot. Moreover, since the surface of the pin gate contact is rough, it is difficult to identify the pin one dot.

SUMMARY OF THE INVENTION

The present invention provides a chip package structure benefiting the recognition of the pin one dot.

The invention further provides a chip package mold chase by using which the pin one dot and the pin gate contact of the chip package structure are located at different positions. Therefore, the problems of hardly identifying the pin one dot or mistakenly recognizing the pin one dot can be resolved.

The present invention provides a chip package process capable of forming the pin one dot which is easily identified.

The present invention provides a package structure including a carrier, a chip and a molding compound. The chip is disposed on the carrier. The molding compound encapsulates a portion of the carrier and the chip. A top surface of the molding compound has a pin one dot and a pin gate contact, and the pin one dot is located at a first corner of the top surface and the pin gate contact is located at a second corner other than the first corner.

According to one embodiment of the present invention, a diameter of the pin gate contact is in a range from 0.5 mm to 3.5 mm.

According to one embodiment of the present invention, the pin gate contact comprises a pin gate contact which has been treated by a surface treatment.

According to one embodiment of the present invention, the surface treatment can be, for example, a laser planarization treatment process.

According to one embodiment of the present invention, the chip package structure further comprises an ejection pin mark located at a third corner other than the first corner and the second corner.

According to one embodiment of the present invention, the pin gate contact is composed of two concentric circles including an outer circle and an inner circle.

According to one embodiment of the present invention, a roughness of the outer circle is smaller than a roughness of the top surface of the molding compound.

According to one embodiment of the present invention, a height of a surface of the inner circle is higher than a height of a surface of the outer circle.

The invention also provides a chip package mold chase comprising a first mold chase and a second mold chase disposed to be opposite to the first mold chase. The first mold chase and the second mold chase are combined to define a cavity. The second mold chase has a pin gate for a molding compound being injected into the cavity, a first corner of a top surface of the cavity has a positioning part, and the pin gate is located at a second corner of the top surface of the cavity other than the first corner.

The invention further provides a chip package process. A carrier is provided. The chip is disposed on the carrier. A first mold chase and a second mold chase opposite to the first mold chase are provided. The first mold chase and the second mold chase are combined to define a cavity, the second mold chase has a pin gate, a first corner of a top surface of the cavity has a positioning part, and the pin gate is located at a second corner of the top surface other than the first corner. The first mold chase and the second mold chase are combined to form the cavity and the carrier and the chip are disposed within the cavity. The molding compound is provided into the cavity through the pin gate to form a chip package structure. The chip package structure comprises the carrier, the chip disposed on the carrier and the molding compound encapsulating a portion of the carrier and the chip. A top surface of the molding compound has a pin one dot which is corresponding to the positioning part. The first mold chase and the second mold chase are removed and, meanwhile, a pin gate contact is formed on the top surface of the molding compound, wherein the pin gate contact is corresponding to the pin gate.

Moreover, since the pin gate contact and the pin one dot are formed at different corners, the pin gate contact can be used as the pin one dot element after the surface treatment is performed on the pin gate contact.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
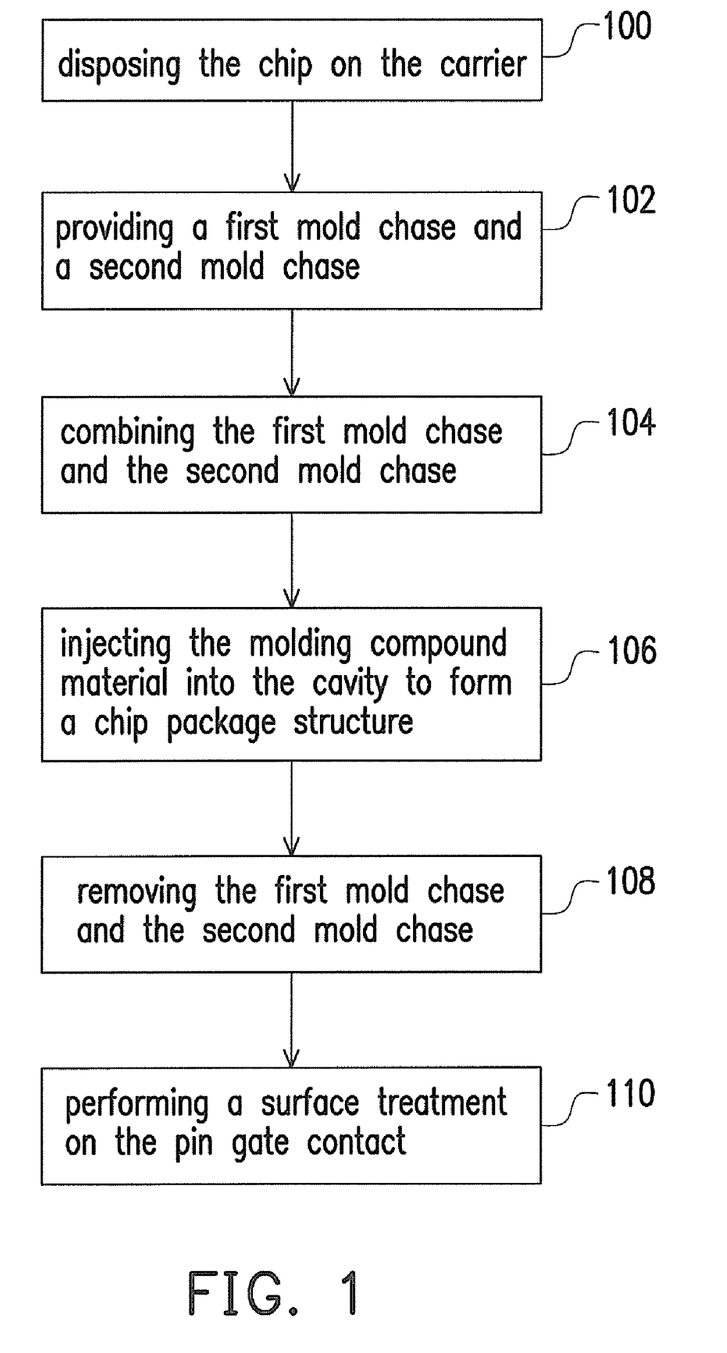
FIG. 1 is a flow chart showing a chip package process according to one embodiment of the present invention.

FIG. 1 is a flow chart showing a chip package process according to one embodiment of the present invention. As shown in FIG. 1, in the step 100, a carrier is provided. The chip is disposed on the carrier. In the present embodiment, the carrier can be, for example, a lead frame. Off course, the carrier is not limited to the lead frame. In the other embodiment, the carrier can be, for example, a substrate. The lead frame can comprise, for example, a die pad and a plurality of leads. The leads are disposed at a periphery of the die pad. The chip is disposed on the die pad and is electrically connected to the leads by wire bonding.

Figure 2:
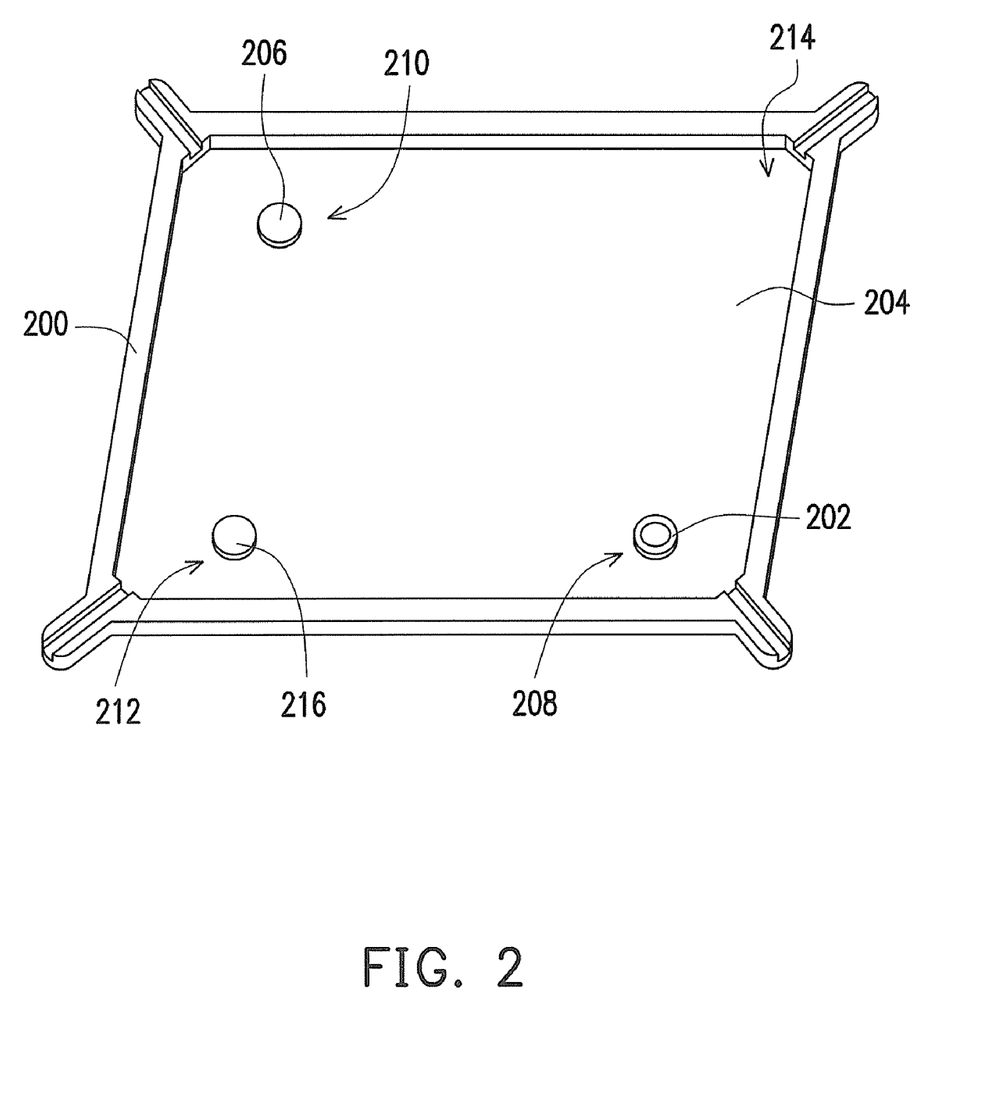
FIG. 2 is a schematic stereo view of a top mold chase according to one embodiment of the present invention.

In the step 102, a first mold chase and a second mold chase opposite to the first mold chase are provided. The first mold chase and the second mold chase are combined to define a cavity. In the present embodiment, the first mold chase is a bottom mold chase and the second mold chase is a top mold chase. The second mold chase (top mold chase) is detailed in the following description. FIG. 2 is a schematic stereo view of a top mold chase according to one embodiment of the present invention. As shown in FIG. 2, the top mold chase 200 has a pin gate 202. In the following steps, the molding compound material is injected into the cavity through the pin gate 202, and the cavity is formed by the combination of the top mold chase and the bottom mold chase. The diameter of the pin gate is in a range from 0.5 mm to 3.5 mm. Preferably, the diameter of the pin gate is about 1-2.5 mm. Moreover, the top of the cavity (the top which is located at the inner surface 204 of the top mold chase 200) has a positioning part 206 for forming the pin one dot on the top of the molding compound in the later formed chip package structure. In the present embodiment, the positioning part 206 is a protrusion. However, in another embodiment, the positioning part can be a recess. The pin gate 202 is located at a corner 208 of the inner surface 204, and the positioning part 206 is located at a corner other than the corner 208. In the present embodiment, the positioning part 206 is located at a corner 210 which is opposite to the corner 208. In the other embodiment, the positioning part 206 can be located at a corner which is adjacent to the corner 208 (such as the corner 212 and the corner 214). Furthermore, in the present embodiment, an ejection pin is located at a corner other than the corner 208 and the corner 210. In the later step for removing the top mold chase and the bottom mold chase, the chip package structure can be separated from the top mold chase by pushing the ejection pin 216 against the formed chip package structure.

In the step 104, the first mold chase and the second mold chase are combined to form the cavity and the carrier and the chip are disposed within the cavity.

In the step 106, the molding compound material is injected into the cavity through the pin gate 202 to form a chip package structure.

Figure 3:
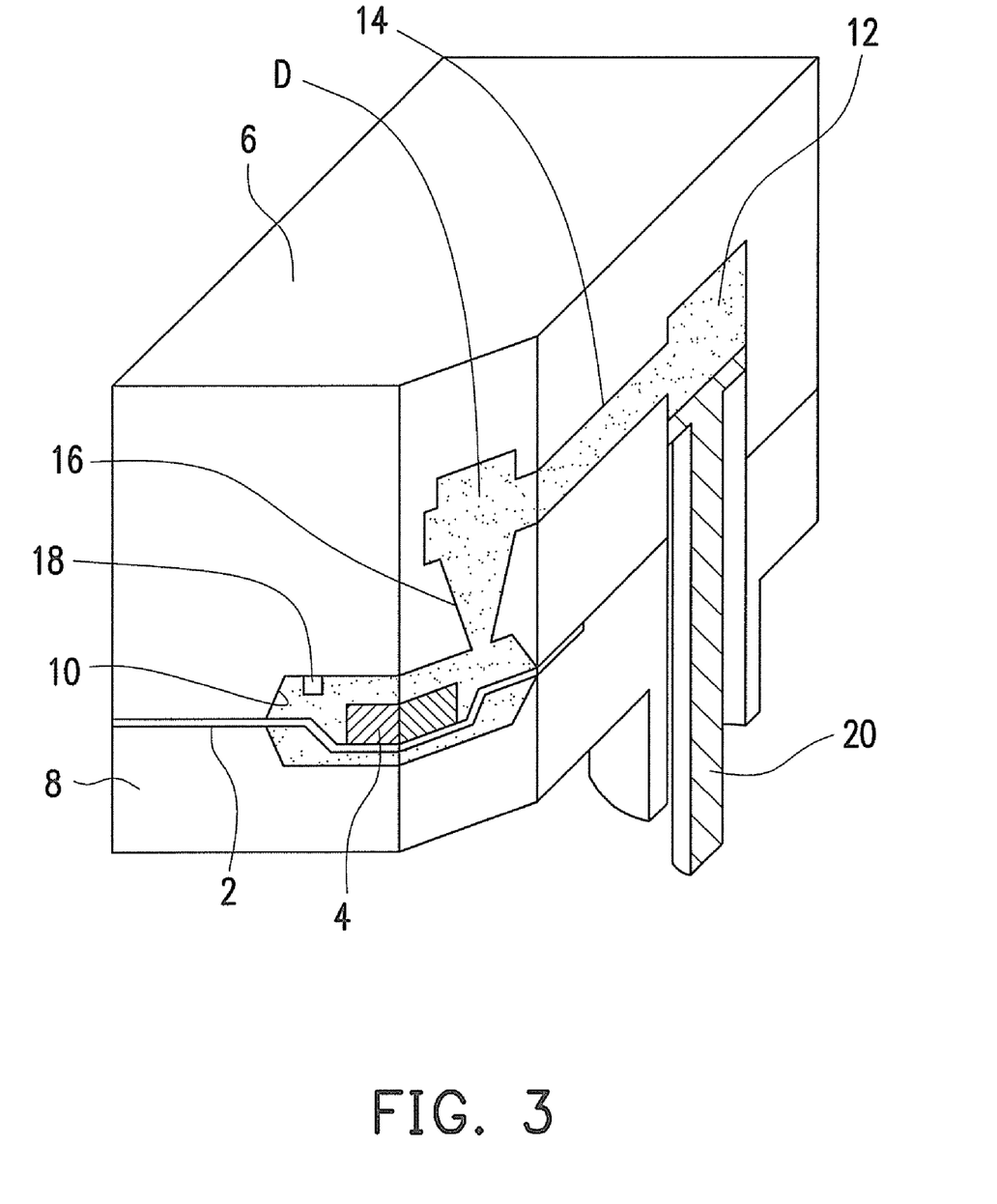
FIG. 3 is a schematic diagram showing a mold chase for forming a package structure and a chip package structure formed by using the mold chase according to one embodiment of the present invention.

The mold chase for forming a package structure and the chip package structure formed by using the mold chase are shown in FIG. 3. FIG. 3 is a schematic diagram showing a mold chase for forming a package structure and a chip package structure formed by using the mold chase according to one embodiment of the present invention. Generally, the chips are disposed on the carrier as an array. However, for more clearly showing the chip package structure, only one chip is used as an exemplar in FIG. 3. As shown in FIG. 3, the chip 4 is disposed on the carrier 2. The top mold chase 6 has a pin gate 16 and a positioning part 18. The positioning part 18 can be, for example, a protrusion. The top mold chase 6 and the bottom mold chase 8 are combined to form the cavity 10. The chip 4 and the carrier 2 are disposed within the cavity 10. By using a piston 20, the melted molding compound material 12 is pressed into an upper fluid channel 14. The melted molding compounding material 12 flows through the upper fluid channel 14. The top fluid channel 14 extends towards to the top of the chip 4 and the carrier 2. The molding compound material 12 in the upper fluid channel 14 downwardly flows to the pin gate 16 through current dividing point D and enters into the cavity 10. After the molding compound material 12 is cured, a molding compound is formed.

In the step 108, the first mold chase (the bottom mold chase) and the second mold chase (the top mold chase) are removed and, meanwhile, a pin gate contact is formed on the top surface of the molding compound. The pin gate contact is corresponding to the pin gate and the pin gate and the pin gate contact have the same internal diameter. FIG. 3 is used in the following description for further details. As shown in FIG. 3, while the top mold chase 6 is removed, the molding compound (i.e. the excess molding compound) in the upper fluid channel 14 and within the pin gate 16 can be separated from the molding compound encapsulating the carrier 2 and the chip 4 (i.e. the molding compound within the cavity 10). Moreover, when the excess molding compound is separated from the molding compound encapsulating the carrier 2 and the chip 4, an irregular crack structure is formed on a position of the molding compound encapsulating the carrier 2 and the chip 4 and the position is corresponding to the pin gate 16. Herein, the crack structure is the pin gate contact.

Moreover, as mentioned above, while the top mold chase is removed, the ejection pin can be used to assist the chip package structure in being separated from the top mold chase. It should be noticed that, while the ejection pin is pushed against the chip package structure for separating the chip package structure from the top mold chase, an ejection pin mark is simultaneously and correspondingly formed on the top surface of the molding compound.

Figure 4:
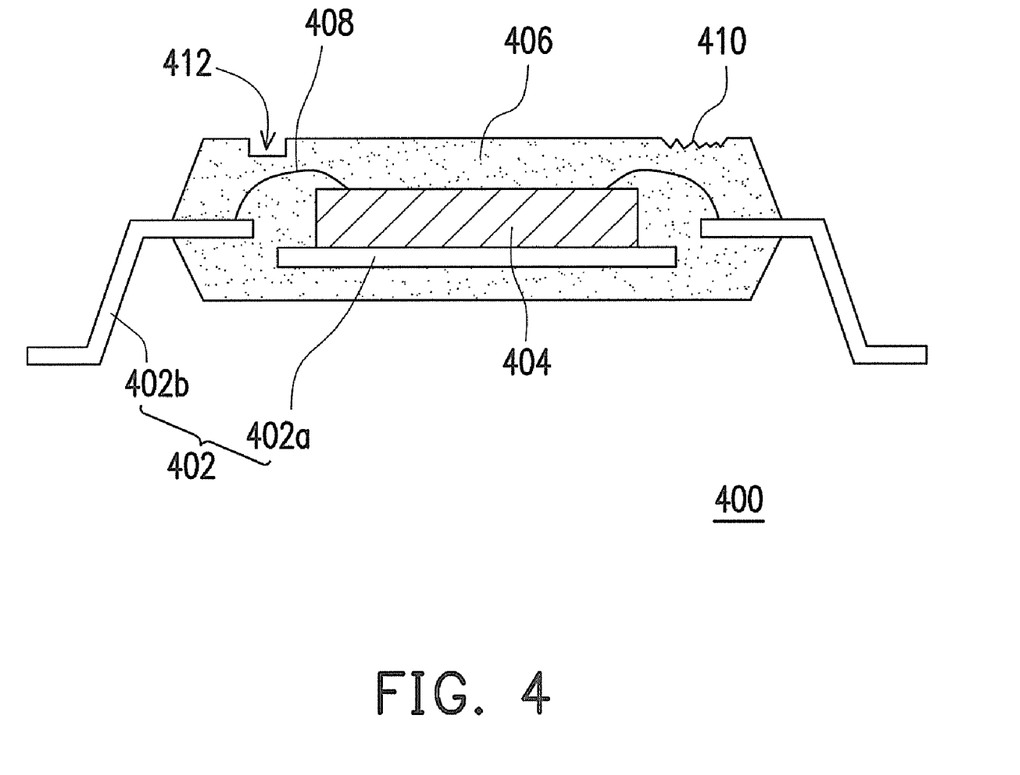
FIG. 4 is a schematic cross-sectional view showing a chip package structure according to one embodiment of the present invention.

FIG. 4 is a schematic cross-sectional view showing a chip package structure according to one embodiment of the present invention. As shown in FIG. 4, the chip package structure 400 is the chip package structure formed by the aforementioned steps. The chip package structure 400 comprises the carrier 402, the chip 404 and the molding compound 406. In the present embodiment, the carrier 402 can be a lead frame comprising a die pad 402a and leads 402b. The chip 404 is disposed on the die pad 402a and is electrically connected to the leads 402b through wires 408. The molding compound 406 encapsulates the chip 404, the die pad 402a and a portion of the leads 402b. A corner of the top surface of the molding compound 406 has an irregular crack structure 410 which is located at the position corresponding to the location of the pin gate 16 shown in FIG. 3, and the irregular crack structure 410 is the aforementioned pin gate contact. Moreover, another corner of the top surface of the molding compound 406 has a recess 412 which is located at the position corresponding to the location of the positioning part 15 shown in FIG. 3, and the recess 412 is the aforementioned pin one dot.

Figure 5:
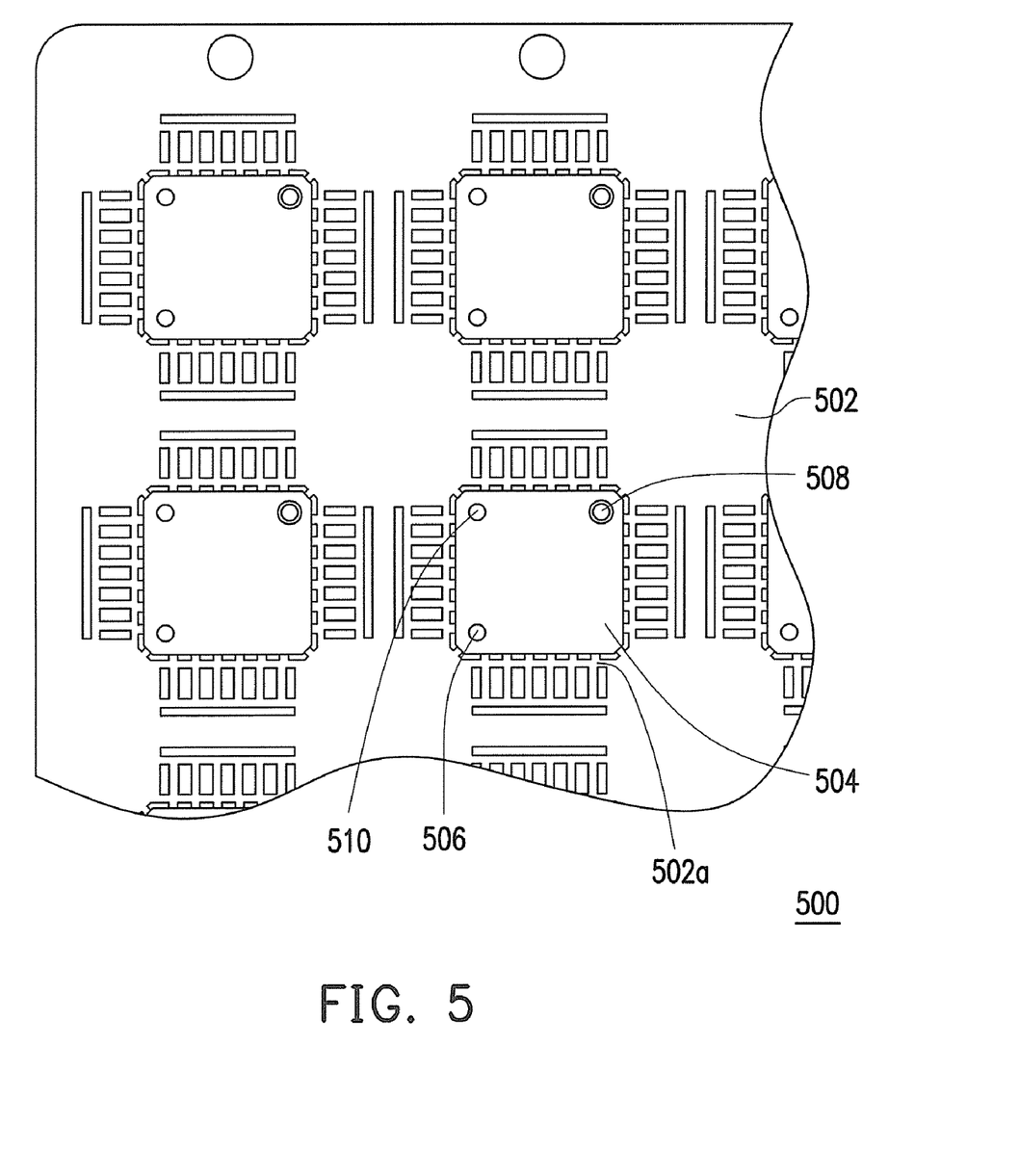
FIG. 5 is a schematic top view showing a chip package structure according to one embodiment of the present invention.

FIG. 5 is a schematic top view showing a chip package structure according to one embodiment of the present invention. In FIG. 5, the chips (not shown) are arranged on the carrier as an array so that the formed package structures are arranged in an array. As shown in FIG. 5, the chip package structure 500 comprises the carrier 502, the chip (not shown) and the molding compound 504. In the present embodiment, the carrier 502 can be, for example, a lead frame comprising a die pad and leads. The chip is disposed on the die pad (not shown) and is electrically connected to the leads 502ba through wires (not shown). The molding compound 504 encapsulates a portion of the chip, the die pad and a portion of the leads 502a. In the process for forming the chip package structure 500, since the inner surface of the top mold chase (i.e. the top surface of the cavity) has a positioning part (the positioning part 206 shown in FIG. 2 and the positioning part 18 shown in FIG. 3) and the positioning part can be, for example, a protrusion, a recess 506 is formed at a corner of the top surface of the molding compound 504 and the corner is corresponding to the positioning part. Herein, the recess 506 is the pin one dot. Alternatively, in another embodiment, if the positioning part is a recess, the pin one dot is a protrusion. Further, another corner of the top surface of the molding compound 504 has an irregular crack structure 508 which is the aforementioned pin gate contact. Additionally, the other corner of the top surface of the molding compound 504 has an ejection pin mark 510 corresponding to the ejection pin.

Accordingly, since the pin one dot (the recesses 412 and 506) and the pin gate contact (the crack structures 410 and 508) are respectively formed on different corners of the top surface of the chip package structure, the recognition of the pin one dot can be effectively avoided from the problem of hardly identifying the pin one dot or mistakenly identifying the pin one dot.

Moreover, according to the practical demands, the pin gate contact (the crack structures 410 and 508) can be used as pin one dot element which possesses the functions as same as those of the pin one dot (the recesses 412 and 506). However, since the roughness of the pin gate contact is the same as the roughness of the top surface of the molding compound, a surface treatment is performed on the pin gate contact in the step 110 to smoothen the pin gate contact in order to avoid from the problem of hardly identifying the pin one dot or mistakenly identifying the pin one dot. The surface treatment can be, for example, a laser planarization process.

Figure 6:
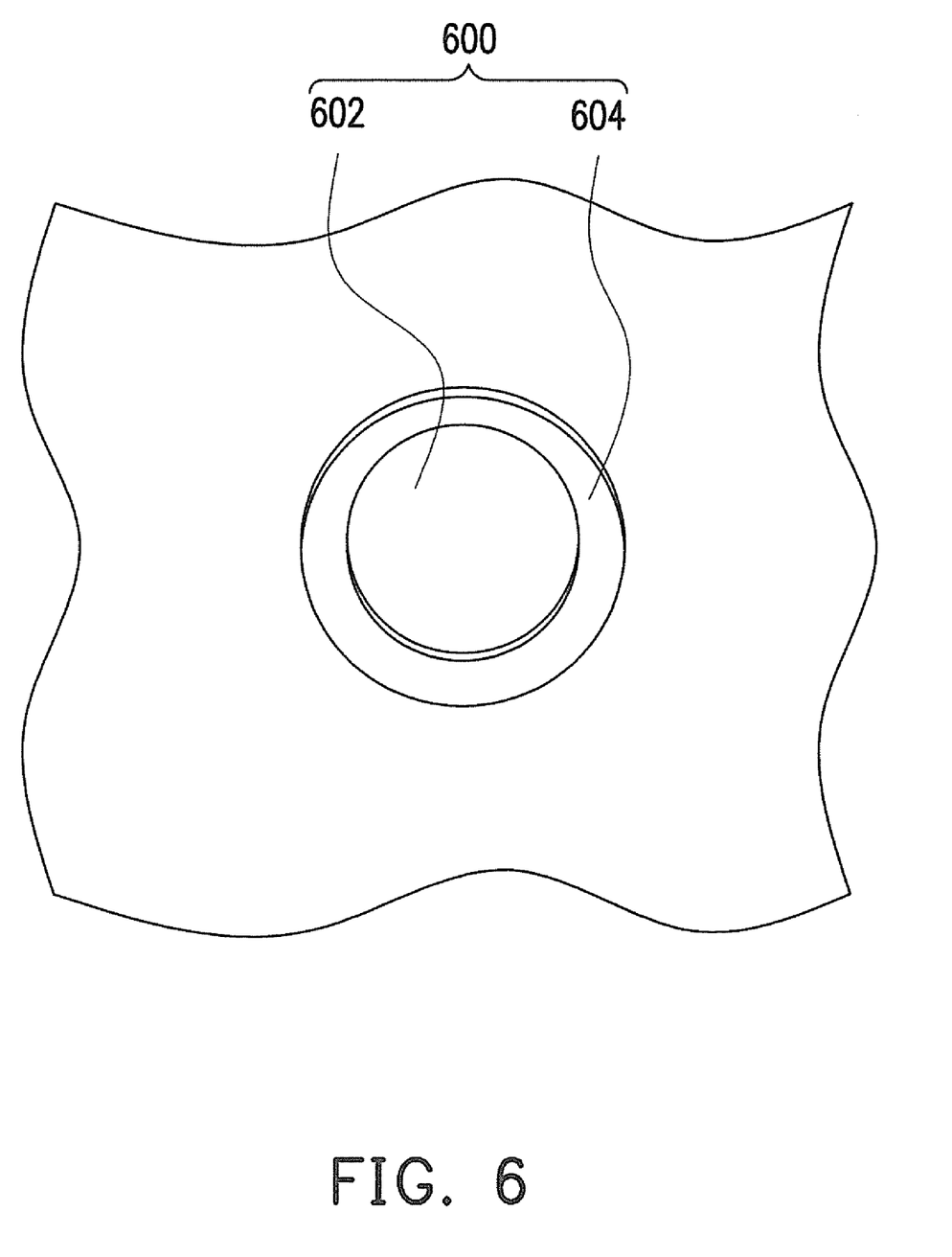
FIG. 6 is a schematic diagram of a pin gate contact according to one embodiment of the present invention.

FIG. 6 is a schematic diagram of a pin gate contact according to one embodiment of the present invention. In the present embodiment, the shape of the pin gate contact is a concentric circle shape. Off course, in the other embodiment, the pin gate contact can be any other shapes according to the designs of the pin gate. As shown in FIG. 6, the pin gate contact 600 is composed of two concentric circles including a circle 602 as the inner circle of the two concentric circles and a circle 604 as the outer circle of the two concentric circles. In the present embodiment, corresponding to the design of the pin gate, the height of the surface of the circle 602 is higher than the height of the surface of the circle 604. Further, in the present embodiment, corresponding to the design of the pin gate, the excess molding compound separated from the molding compound encapsulating the carrier and the chip leads to the roughness of the surface of the circle 604 equal to the roughness of the top surface of the molding compound so that the problem of hardly identifying the pin one dot or mistakenly identifying the pin one dot occurs. Therefore, as mentioned above, the surface treatment can be performed on the circle 604 of the pin gate contact 600 to smoothen the surface of the circle 604. That is, the surface of the circle 604 is smoother than the top surface of the molding compound.

Accordingly, in the present invention, the pin one dot and the pin gate are respectively formed on different corners of the top surface of the chip package structure. Therefore, the recognition of the pin one dot can be effectively avoided from the problem of hardly identifying the pin one dot or mistakenly identifying the pin one dot.

Moreover, in the chip package structure of the present invention, since the pin gate contact and the pin one dot are formed at different corners, the pin gate contact can be used as the pin one dot element after the surface treatment is performed on the pin gate contact.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A chip package structure, comprising:
a carrier;
a chip disposed on the carrier; and
a molding compound encapsulating a portion of the carrier and the chip, wherein a top surface of the molding compound has a pin one dot and a pin gate contact, and the pin one dot is located at a first corner of the top surface and the pin gate contact is located at a second corner other than the first corner, wherein the pin gate contact is composed of two concentric circles including an outer circle and an inner circle.

2. The chip package structure of claim 1, wherein a diameter of the pin gate contact is in a range from 0.5 mm to 3.5 mm 3. The chip package structure of claim 2, wherein a diameter of the pin gate contact is in a range from 1 mm to 2.5 mm 4. The chip package structure of claim 1, wherein the pin gate contact comprises a pin gate contact which has been treated by a surface treatment.

5. The chip package structure of claim 4, wherein the surface treatment comprises a laser planarization process.

6. The chip package structure of claim 1, further comprising an ejection pin mark located at a third corner other than the first corner and the second corner.

7. The chip package structure of claim 1, wherein a roughness of the outer circle is smaller than a roughness of the top surface of the molding compound.

8. The chip package structure of claim 1, wherein a height of a surface of the inner circle is higher than a height of a surface of the outer circle.

9. The chip package structure of claim 1, wherein the carrier comprise a lead frame.

10. The chip package structure of claim 9, wherein the lead frame comprises a die pad and a plurality of leads, wherein the leads are disposed at a periphery of the die pad, and the chip is disposed on the die pad and is electrically connected to the leads by wire bonding.

11. The chip package structure of claim 10, wherein the molding compound encapsulates the chip, the die pad and a portion of the leads.

12. The chip package structure of claim 1, wherein the carrier comprise a substrate.

13. The chip package structure of claim 1, wherein the pin one dot is a recess.

14. The chip package structure of claim 1, wherein the pin one dot is a protrusion.

15. The chip package structure of claim 1, wherein the roughness of the surface of the pin gate contact is equal to the roughness of the top surface of the molding compound.

16. The chip package structure of claim 6, wherein the pin gate contact is adjacent to the ejection pin mark.

17. The chip package structure of claim 6, wherein the pin one dot is adjacent to the ejection pin mark.

18. The chip package structure of claim 1, wherein the pin one dot is opposite to the pin gate contact.

19. The chip package structure of claim 4, wherein the pin gate contact is used as a pin one dot element.

* * * * *